(12) United States Patent
Cheng et al.

(10) Patent No.: US 9,859,388 B1
(45) Date of Patent: Jan. 2, 2018

(54) UNIFORM VERTICAL FIELD EFFECT TRANSISTOR SPACERS

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/185,712

(22) Filed: Jun. 17, 2016

(51) Int. Cl.
| | | |
|---|---|---|
| *H01L 27/088* | (2006.01) | |
| *H01L 29/417* | (2006.01) | |
| *H01L 29/78* | (2006.01) | |
| *H01L 29/06* | (2006.01) | |
| *H01L 29/66* | (2006.01) | |
| *H01L 21/306* | (2006.01) | |

(52) U.S. Cl.
CPC .. *H01L 29/41791* (2013.01); *H01L 21/30604* (2013.01); *H01L 29/0649* (2013.01); *H01L 29/66553* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 6,518,616 B2 | 2/2003 | Dyer et al. | |
| 6,660,590 B2 | 12/2003 | Yoo | |
| 6,846,709 B1 | 1/2005 | Lojek | |
| 7,015,092 B2 | 3/2006 | Jaiprakash et al. | |
| 7,033,877 B2 | 4/2006 | Chaudhry et al. | |
| 7,230,286 B2 | 6/2007 | Cohen et al. | |
| 8,105,902 B2 | 1/2012 | Shin | |
| 8,492,257 B2 * | 7/2013 | Shin | H01L 27/10876 257/E21.19 |
| 8,637,849 B2 | 1/2014 | Deligianni et al. | |
| 9,129,847 B2 | 9/2015 | Gonzalez | |
| 2014/0008736 A1 | 1/2014 | Li et al. | |
| 2016/0086796 A1 | 3/2016 | Chan et al. | |

OTHER PUBLICATIONS

V. Kunz et al., "Reduction of Parasitic Capacitance in Vertical MOSFETS by Spacer Local Oxidation," IEEE Transactions on Electron Devices, vol. 50., No. 6, Jun. 2003; pp. 1487-1493.

* cited by examiner

*Primary Examiner* — Jack Chen
(74) *Attorney, Agent, or Firm* — Cantor Colburn LLP

(57) ABSTRACT

Aspects of the disclosure include a semiconductor structure that includes a vertical fin structure having a top portion, a bottom portion, vertical side walls, a source area in contact with the vertical fin structure, a drain area in contact with the vertical fin structure, a plurality of spacers comprising a first oxide layer in contact with the source area, and a second oxide layer in contact with the drain area. The first oxide layer can have a thickness that is equal to a thickness of the second oxide layer.

17 Claims, 10 Drawing Sheets

UNIFORM VERTICAL FIELD EFFECT TRANSISTOR SPACERS

BACKGROUND

The present invention relates to semiconductor devices, and more specifically, to a vertical field effect transistor (VFET) having uniform spacers and methods of fabricating the same.

A VFET has a channel perpendicular to the substrate surface, as opposed to a conventional FET, which has a channel extending substantially along the plane of the surface of the device substrate. By using this vertical channel design, it is possible to increase packing density. That is, by forming the channel substantially perpendicular to the substrate surface, VFETs improve the scaling limit beyond FET devices that have their channels positioned substantially parallel to the substrate surface. However, aspects of forming VFETs are challenging as semiconductor fabrication processes move past 7 nm node spacing. In general, the term "node" refers to the major targets or features in a fabrication roadmap. Conventional FET sidewall spacer formation can use deposition followed by reactive ion etching, for example. However, this mode of spacer formation is not possible in VFET manufacture due to the horizontal spacer arrangement. Accordingly, spacer formation in vertical FET fabrication can be challenging.

SUMMARY

In accordance with one or more embodiments, semiconductor structure includes a vertical fin structure having a top portion, a bottom portion, and vertical side walls. The semiconductor structure also includes a source area in contact with the vertical fin structure. The semiconductor structure includes a drain area in contact with the vertical fin structure. The semiconductor structure also includes a plurality of spacers having a first oxide layer in contact with the source area, and a second oxide layer in contact with the drain area. In accordance with one or more embodiments, the first oxide layer has a thickness that is equal to a thickness of the second oxide layer.

In accordance with another embodiment, a method of forming a semiconductor structure includes forming a film stack on a substrate, the film stack including a bottom SiGe layer, a silicon layer on top of the bottom SiGe layer, and a top SiGe layer on top of the silicon layer. The method also includes patterning a plurality of vertical structures formed of the top SiGe layer and silicon layer. The method also includes selectively etching the silicon layer to form a plurality of vertical fins, the vertical fins having vertical sidewalls. The method also includes simultaneously forming an oxide layer on the SiGe layers to create a plurality of spacers.

In accordance with yet another embodiment, a method of forming a vertical semiconductor structure includes depositing a first layer on a substrate, the first layer including a film composed of a material suitable for a source material or a drain material and having an oxidation rate that is faster than the oxidation rate for a silicon material. The method also includes depositing the silicon material on the first layer. The method also includes depositing a second layer of the film on the silicon material. The method also includes etching the semiconductor structure to form a vertical fin, a source, and a drain, wherein the source and drain are composed of the material and the vertical fin is composed of the silicon material. The method also includes performing a low temperature oxidation on the semiconductor structure to create spacers around the source and the drain.

BRIEF DESCRIPTION OF THE DRAWINGS

The subject matter of the present disclosure is particularly pointed out and distinctly claimed in the claims at the conclusion of the specification. The foregoing and other features and advantages of the one or more embodiments disclosed herein are apparent from the following detailed description taken in conjunction with the accompanying drawings in which:

FIGS. 2A through 2F illustrate an exemplary fabrication process of forming a VFET according to one or more embodiments, in which:

FIG. 2A is a cross-sectional view of the device illustrating formation of a SiGe/Si/SiGe film stack of the transistor device according to one or more embodiments;

FIG. 2B is a cross-sectional view of the device illustrating formation of fins of the VFET according to one or more embodiments;

FIG. 2C is a cross-sectional view of the transistor device illustrating selectively etching the Si film according to one or more embodiments;

FIG. 2D is a cross-sectional view of the transistor device illustrating formation of an oxide layer according to one or more embodiments;

FIG. 2E is a cross-sectional view of the transistor device illustrating removal of the oxide layer from the fin sidewalls according to one or more embodiments;

FIG. 2F is a cross-sectional view of the transistor device illustrating further gate fabrication processes.

DETAILED DESCRIPTION

The invention relates to semiconductor structures and, more particularly, to vertical field effect transistors (VFETs) with improved performance. More specifically, VFETs of the present disclosure can provide improved insulation between a gate and the source and drain regions by providing a uniform spacer thickness in spacers formed around the source regions in comparison with spacers formed around the drain regions. Differing rates of oxidation between source/drain material and fin material can advantageously be relied upon in order to selectively and simultaneously form a spacer of the desired thickness around source regions and drain regions, while minimizing the oxidation around a vertical fin. By using the same material for source and drain, and forming the spacer layer around the source and drain in the same manufacturing step, the spacers formed can have a uniform thickness. Spacers of a uniform thickness can have reduced variation in insulation performance within a semiconductor structure, resulting in improved device performance.

In addition, the disclosure provides improved methods of manufacturing VFETs. Conventional sidewall spacer formation can involve spacer formation by deposition followed by a reactive ion etch (ME) process. This conventional spacer formation is not applicable in VFET structures because the spacers in VFET structures are horizontal. The present disclosure provides simultaneous spacer formation around the source and drain in the vertical structure, while forming only a thin oxide layer around the vertical fins that can subsequently be removed. The fabrication of VFETs according to the present disclosure is improved over other methods, for example, because multiple structures can be formed simultaneously. Embodiments of the present disclosure can allow simultaneous source and drain formation. Moreover, the present disclosure provides further improvements in fabrication techniques by allowing simultaneous formation of spacers surrounding the source and drain regions.

Figure 1A:
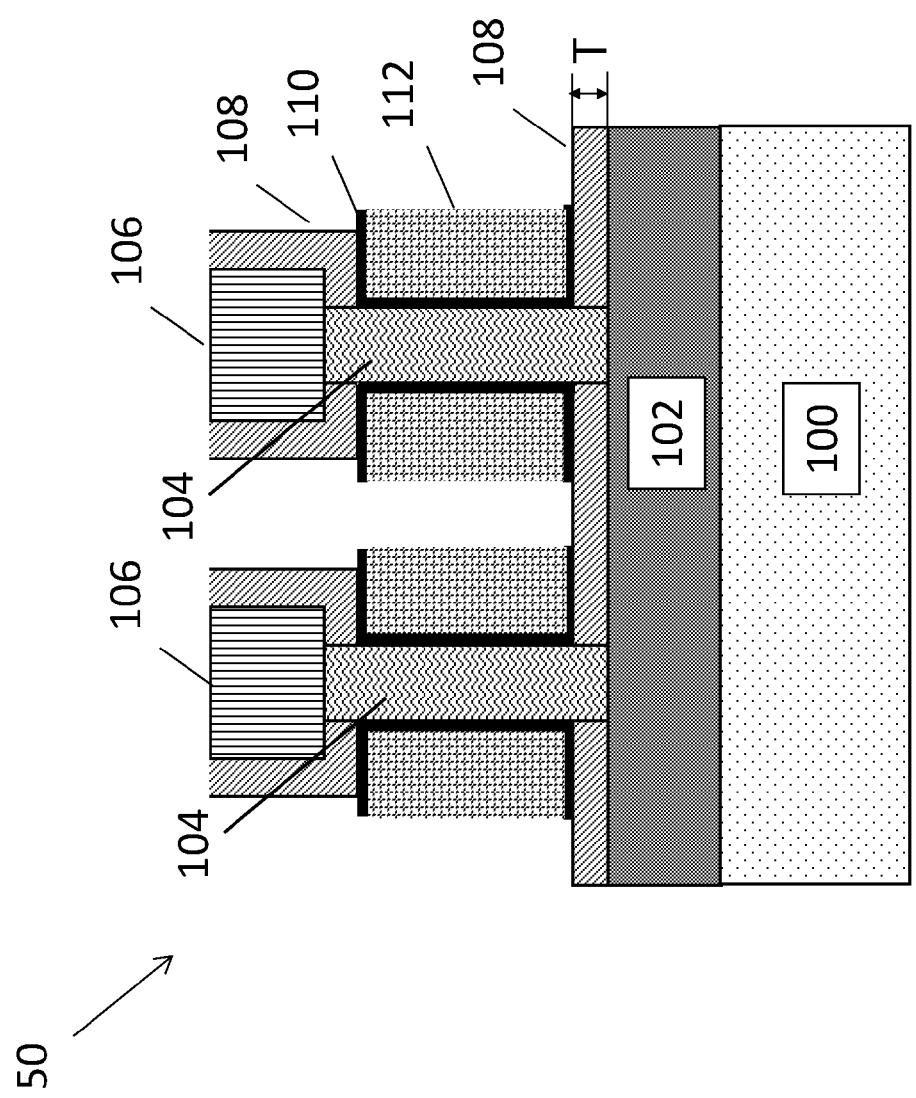
FIG. 1A is a cross-sectional view of a vertical field effect transistor (VFET) according to an embodiment of the present invention.

FIG. 1A is a cross-sectional view of a VFET device 50 according to an embodiment. The VFET according to an exemplary embodiment includes a substrate 100. A semiconductor substrate 100 can be, for example, a bulk substrate including semiconductor material including, but not limited to, silicon (Si), silicon germanium (SiGe), strain-relaxed buffer (SRB) SiGe, silicon carbide (SiC), silicon-germanium-carbon (SiGeC) or other like semiconductor. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide. In addition, multiple layers of the semiconductor materials can be used as the semiconductor material of the substrate. The substrate 100 may be silicon (e.g., a silicon wafer). In one embodiment, the VFET also includes a drain region 102 adjacent the substrate. In one embodiment, the VFET also includes a plurality of fins 104 positioned atop the drain region 102. The fins 104 are vertical fins composed of silicon. The VFET also includes a plurality of source regions 106. In an embodiment, each source region 106 is positioned atop a fin 104 of the VFET device. The VFET device also includes spacers 108. Spacers 108 are positioned on top of the drain 102 and adjacent the source regions 106. The spacers 108 can be composed of any oxide-based dielectric or insulating material that can be used for this purpose, including but not limited to silicon oxide, silicon nitride, boron nitride, silicon carbon, silicon oxynitride, and combinations thereof. In accordance with an embodiment, the spacers 108 adjacent the source regions 106 and on top of the drain regions 102 have a uniform thickness T. As is shown, each source region 106 contacts the top portion of the vertical fin structures 104 and the drain region 102 contacts the bottom of the vertical fin structures 104.

Figure 1B:
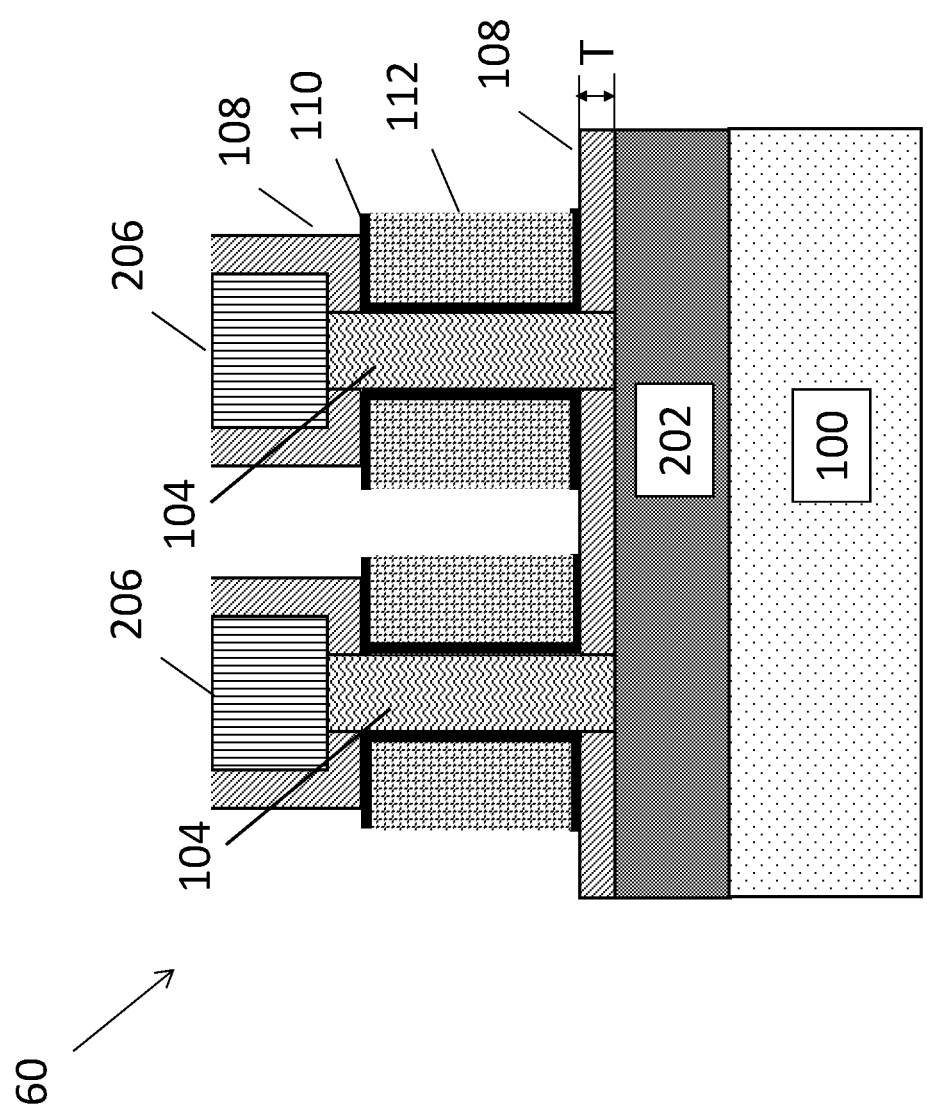
FIG. 1B is a cross-sectional view of a VFET according to another embodiment of the present invention.

FIG. 1B is a cross-sectional view of a VFET device 60 according to an alternate embodiment. The VFET according to an exemplary embodiment includes a substrate 100. In one embodiment, the VFET also includes a source region 202 adjacent the substrate. In one embodiment, the VFET also includes a plurality of fins 104 positioned atop the source region 202. The VFET also includes a plurality of drain regions 206. In an embodiment, each drain region 206 is positioned atop a fin 104 of the VFET device. The VFET device also includes spacers 108. Spacers 108 are positioned on top of the source region 202 and adjacent the drain regions 206. In accordance with an embodiment, the spacers 108 adjacent the drain regions 206 and on top of the source region 202 have a uniform thickness T. As is shown, each drain region 206 contacts the top portion of the vertical fin structures 104 and the source region 202 contacts the bottom of the vertical fin structures 104.

The source and drain regions, 102, 106, 202, and 206 are formed from a material having an oxidation rate that is faster than the oxidation rate for silicon. Preferably, the source and drain regions are composed of SiGe (silicon germanium). The source and drain regions can be formed from the same material or of different materials. Preferably, the source and drain regions are formed from the same type of material.

The dimensions of the source and drain regions and the vertical fins can be chosen based upon the desired pitch and dimensions of the VFET structure. For example, source and/or drain regions can have a thickness of 20 nanometers (nm) to 50 nm. The vertical fins can have a height that is greater than the width. In some embodiments, the vertical fins have a height of 30 nm to 100 nm. For example, an exemplary VFET structure can have source and drain heights of 30 nm and a fin height of 40 nm.

The thickness of the spacers 108 can be controlled by virtually self-limiting oxidation. For example, oxidation can be controlled to oxide the SiGe surface layer to a desired thickness. For example, the thickness of the spacers 108 can be from 5 nm to 10 nm. In one embodiment, the spacers have a thickness of 5 nm to 7 nm, or a thickness of 6 nm.

Figure 2A:
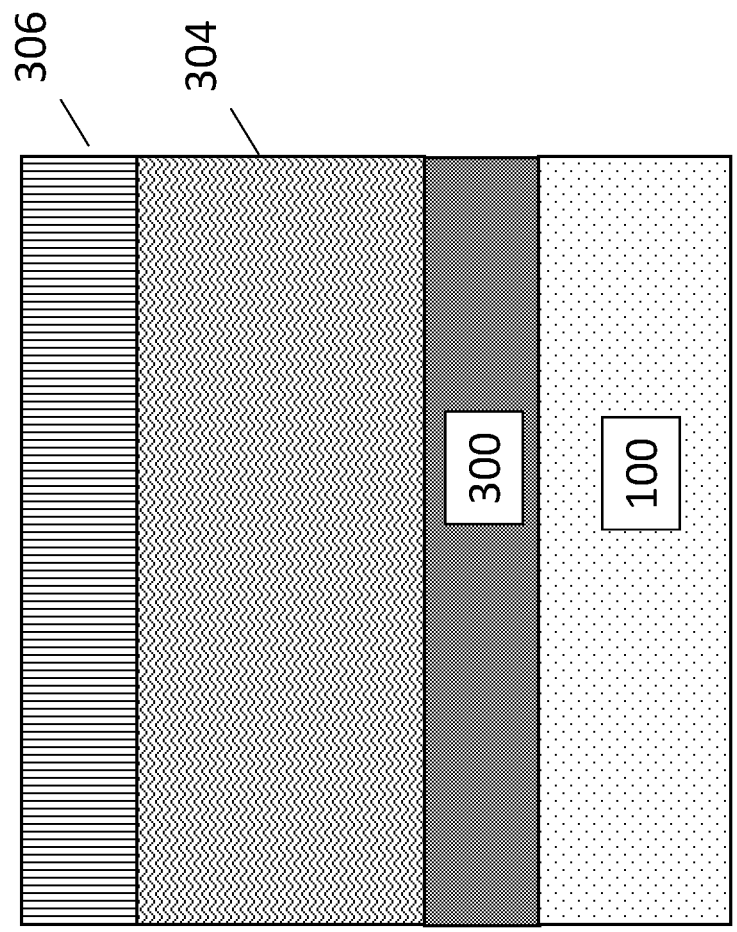

FIGS. 2A through 2F illustrate an exemplary fabrication process of forming a VFET according to one or more embodiments. FIG. 2A is a cross-sectional view illustrating formation of a SiGe/Si/SiGe film stack of the transistor device according to one or more embodiments. A film stack is grown on a substrate 100. The film stack includes a bottom film layer 300, a silicon layer 304 atop the bottom film layer 300, and a top film layer 302 atop the silicon layer 304. The bottom film layer 300 and top film layer 302 are composed of a material having an oxidation rate that is faster than the oxidation rate for silicon, preferably SiGe. The bottom film layer 300 and top film layer 302 can be composed of the same material or of different materials. Preferably, the bottom film layer 300 and top film layer 302 are composed of the same material.

Figure 2B:
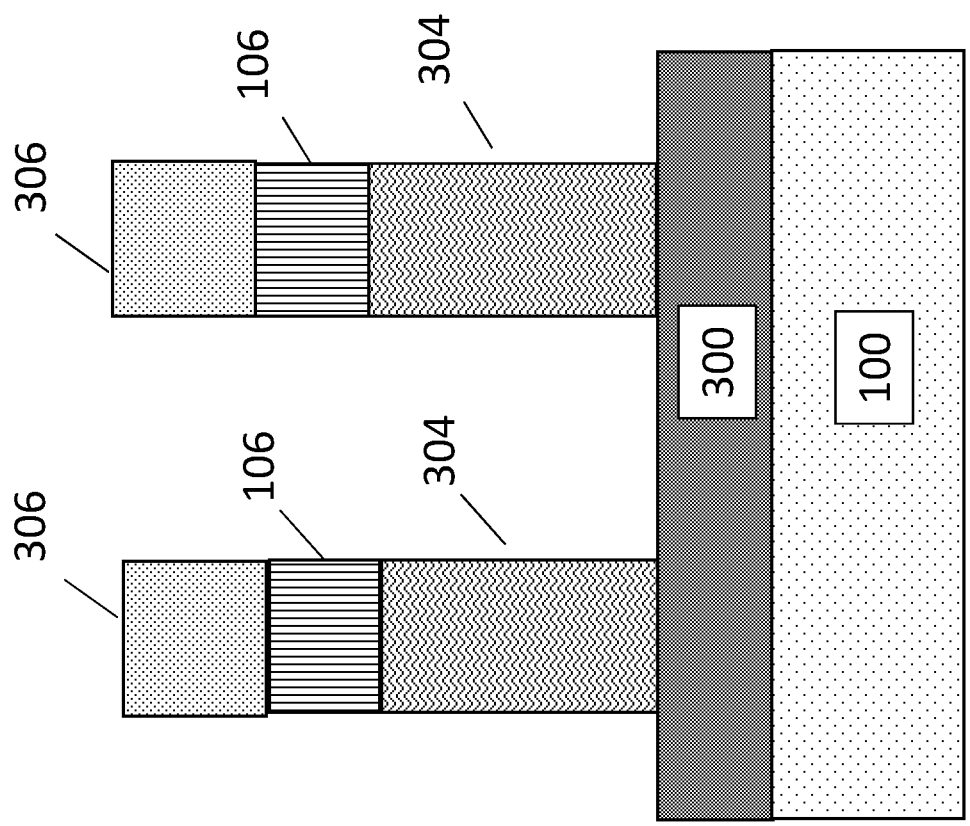

FIG. 2B is a cross-sectional view of the device illustrating formation of fins of the VFET according to one or more embodiments. A plurality of vertical structures 310 are formed on the bottom film layer 300 by patterning the silicon layer 304 and the top layer 302. In one or more embodiments, fins are patterned with lithography, such as sidewall image transfer (SIT). SIT involves the usage of a sacrificial structure (e.g., a mandrel, typically composed of a polycrystalline silicon, amorphous silicon, silicon oxide, amorphous carbon or the like). A sidewall spacer (such as silicon dioxide or silicon nitride, Si3N4, for example) having a thickness less than that permitted by the current recommended ground rules is formed on the sides of the mandrel (e.g., via oxidization or film deposition and etching). After removal of the mandrel, the remaining sidewall spacer is used as a hard-mask to etch the layer(s) below, for example, with a directional reactive ion etch (RIE). Because the sidewall has a (sublithographic) width less than the recommended ground rules, the structure formed in the layer below will also have a sublithographic width. A hard-mask 306 is deposited on the vertical structures 310. The hard-mask 306 can include any material with resistance to RIE such as, as non-limiting examples, a thermal oxide, as silicon oxide, a silicon nitride, a silicon carbo nitride. Preferably, the hard-mask includes silicon nitride.

Figure 2C:
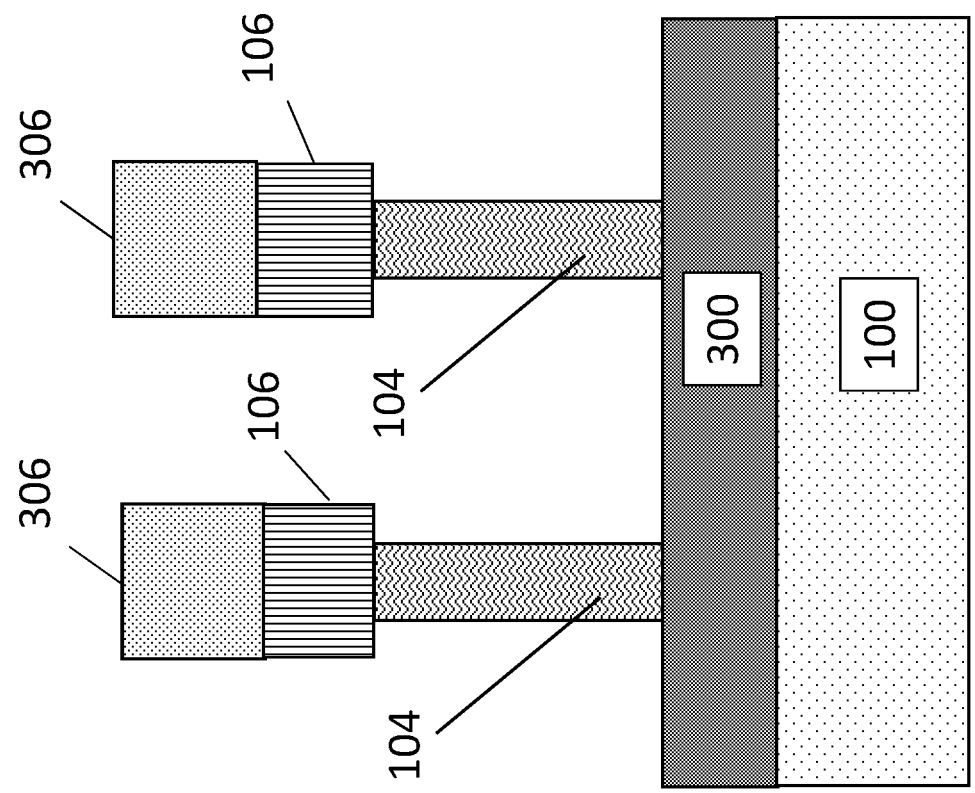

FIG. 2C is a cross-sectional view of the device illustrating formation of the vertical fins by selectively etching according to one or more embodiments. A lateral pull back etching process can be performed during after the fin formation to etch the fin laterally and partially beneath the source drain regions 106 and the top layer 306. An isotropic Si etch process may be employed for this purpose and the etch process can be selective to SiGe and nitride hardmask. Hydrofluoric nitric acid (HNA) can be employed for the isotropic etching of silicon. This process can be timed so that the Si fin is laterally etched, so that the edge of the fin sidewall after the pull back is located under region 106. As is shown, the silicon layer can be selectively wet etched to form a plurality of vertical fins, the vertical fins having vertical sidewalls. The silicon etching process is selective to silicon germanium and other materials, such that the silicon is etched at a faster rate than either of the top film layer 300 or the top film layer 302. In one or more embodiments, the selective silicon etching is a dry etch process (e.g., plasma etch).

Figure 2D:
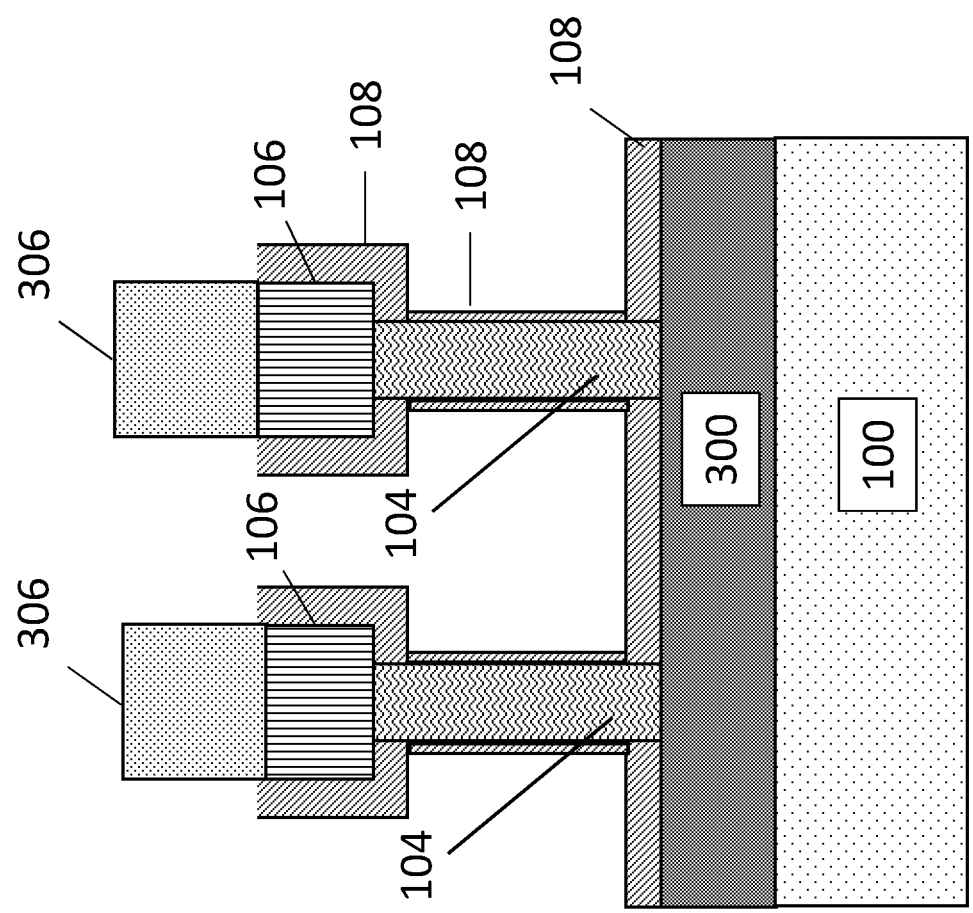

FIG. 2D is a cross-sectional view of the device illustrating formation of an oxide layer according to one or more embodiments. In one or more embodiments, a low temperature oxidation is performed to oxidize the top film layer and the bottom film layer and form a spacer 314 adjacent to the top film layer 302 and bottom film layer 300. The oxidation of the top film layer 302 and the bottom film layer 300 proceeds at a faster rate than the oxidation of the silicon vertical fin 104. As is shown, a thin oxide layer 312 can form on the vertical fin side walls. The oxidation is preferably conducted at a temperature of less than or equal to 750° C., more preferably at a temperature of 600° C. to 700° C. For example, a low temperature oxidation can minimize dopant diffusion in the top and bottom film layers, which eventually can serve as the source and drain of the VFET. In some embodiments, the spacer 314 formed on the top film layer 302 and bottom film layer 300 has a thickness of less than 10 nm, such as 6 nm.

Figure 2E:
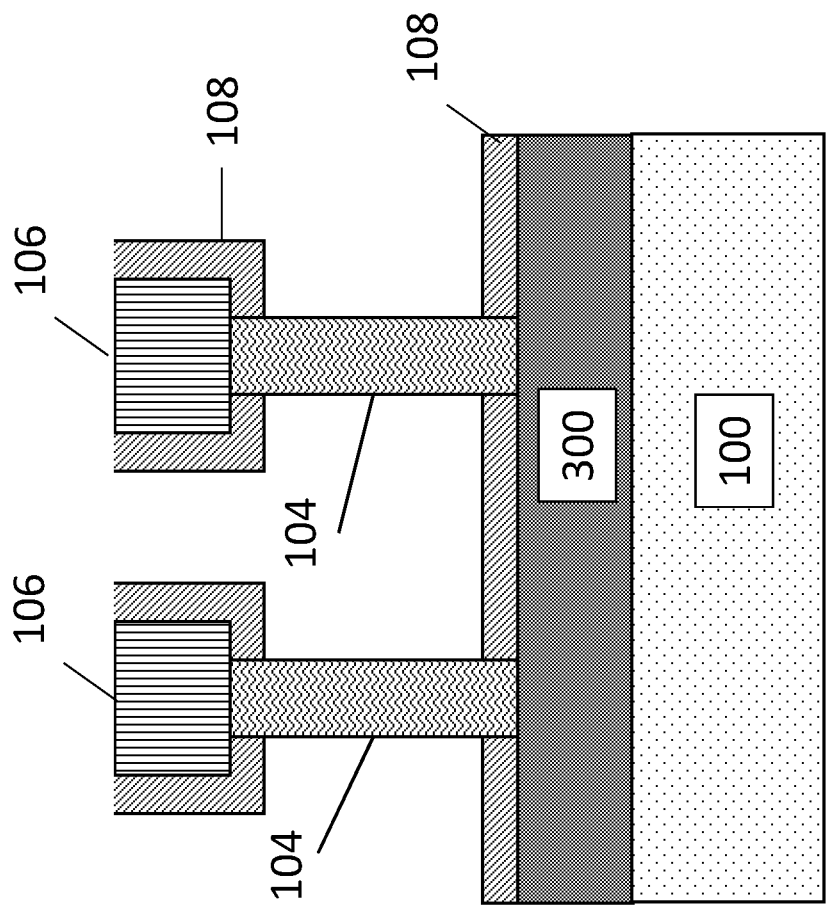

FIG. 2E is a cross-sectional view of the device illustrating removal of the oxide layer from the vertical fin sidewalls according to one or more embodiments. The hard-mask from the prior step is removed using standard techniques, such as a wet chemistry comprising phosphoric acid and deionized water, can be used to remove the hard mask. Then, the thin oxide layer is removed from the vertical fins 104, for example, by a high-k precleaning process (for example an aqueous solution containing hydrofluoric acid or the like).

Figure 2F:
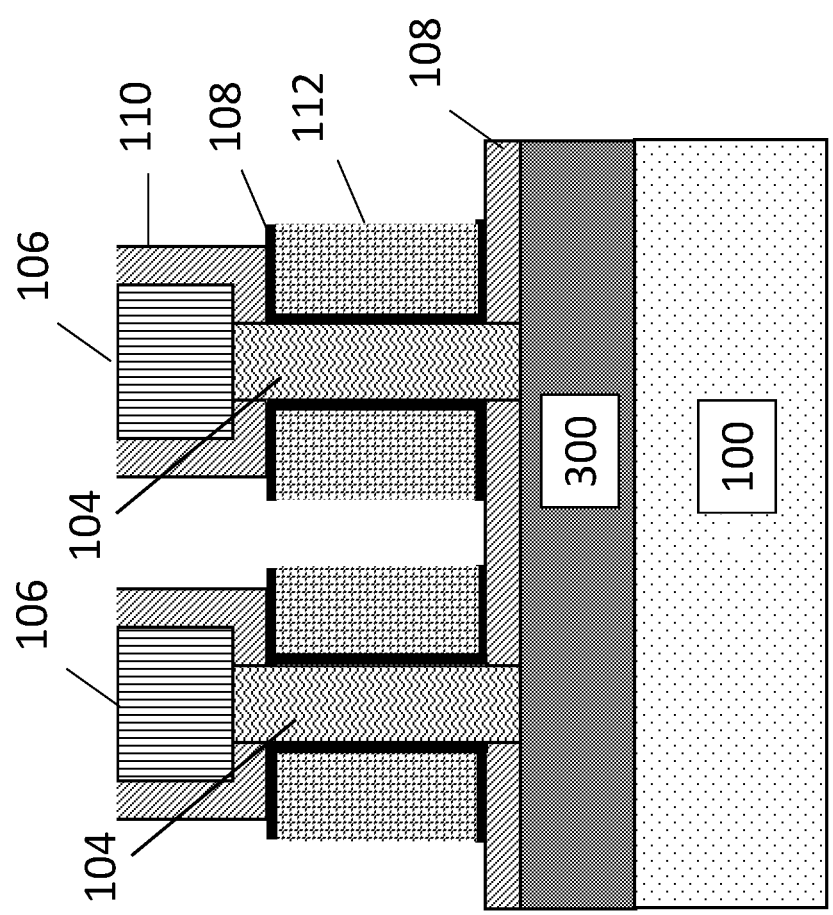

FIG. 2F is a cross-sectional view of the device illustrating further gate fabrication processes. In some embodiments, a gate dielectric layer 316 is formed on edges of spacer 314 and along the vertical fins 104 and a gate 318 is formed adjacent the gate dielectric layer 316 in between the bottom film layer 300 and the top film layer 302. The bottom film layer 300 can be a source or a drain and the top film layer 302 can be a source or drain. For example, the bottom film layer 300 can be a source and the top film layer 302 can be a drain 302. Alternatively, the bottom film layer 300 can be a drain and the top film layer 302 can be a source. The gate 318 can be composed of any gate material useful in VFET devices. In some embodiments, replacement metal gate (RMG) techniques are used. In accordance with the present disclosure, the gate 318 can include sacrificial gate material, such as a polysilicon material or oxide material. In some embodiments, the gate is a metal gate. The gate dielectric layer 318 includes a high k dielectric material, including but not limited to, for example, silicon oxide, hafnium oxide, silicon nitride, aluminum oxide, germanium oxide, silicon oxynitride and others. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

The gate dielectric layer 318 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

In some embodiments, work function metal(s) are disposed over the gate dielectric layer. The type of work function metal(s) depends on the type of device. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The gate conductive material can be polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition.

In accordance with the disclosure, by forming the spacers in a single step, the thickness of the spacers is uniform in the VFET device. Additionally, in some embodiments, the source and drain can be formed in a single step simplifying the manufacture of the device.

Figure 3:
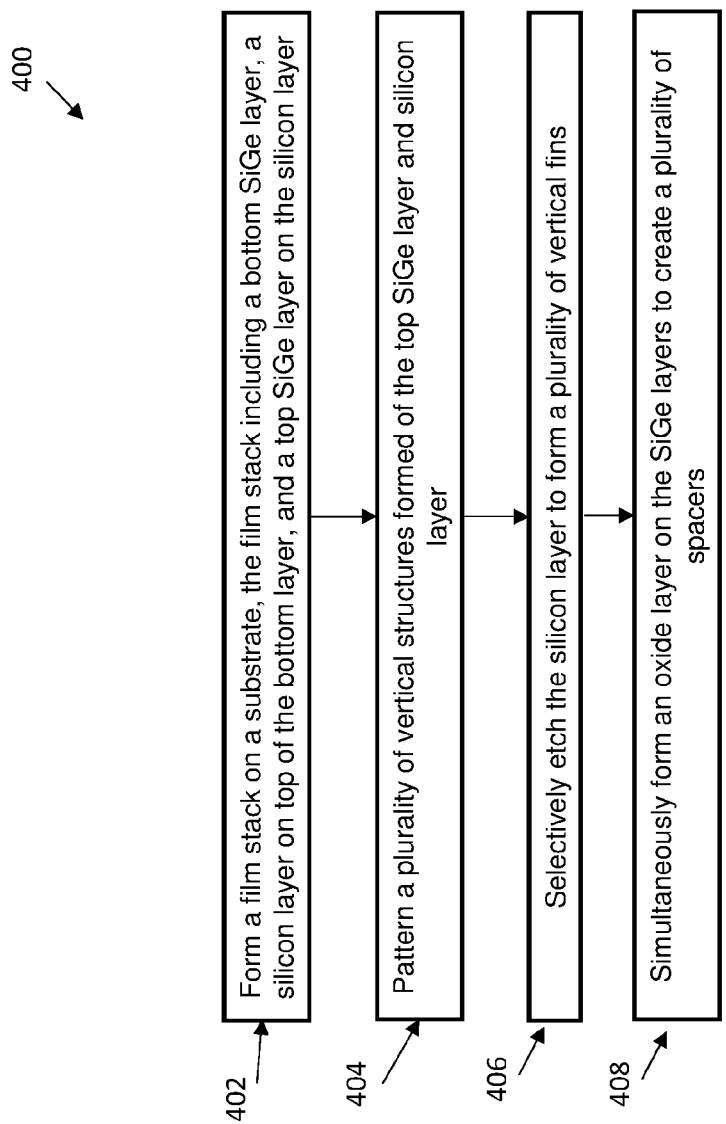
FIG. 3 is a flow diagram illustrating a method of forming a semiconductor structure according to one or more embodiments.

FIG. 3 is a flow diagram illustrating a method of forming a semiconductor structure according to one or more embodiments. The method 400 includes, as shown at block 402, forming a film stack on a substrate, the film stack including a bottom SiGe layer, a silicon layer on top of the bottom layer, and a top SiGe layer on the silicon layer. As shown at block 404, the method 400 also includes patterning a plurality of vertical structures, wherein the vertical structures are formed of the top SiGe layer and the silicon layer. The method 400 also includes, as shown at block 406, selectively etching the silicon layer to form a plurality of vertical fins. As shown at block 408, the method 400 also includes simultaneously forming an oxide layer on the SiGe layers to create a plurality of spacers.

Figure 4:
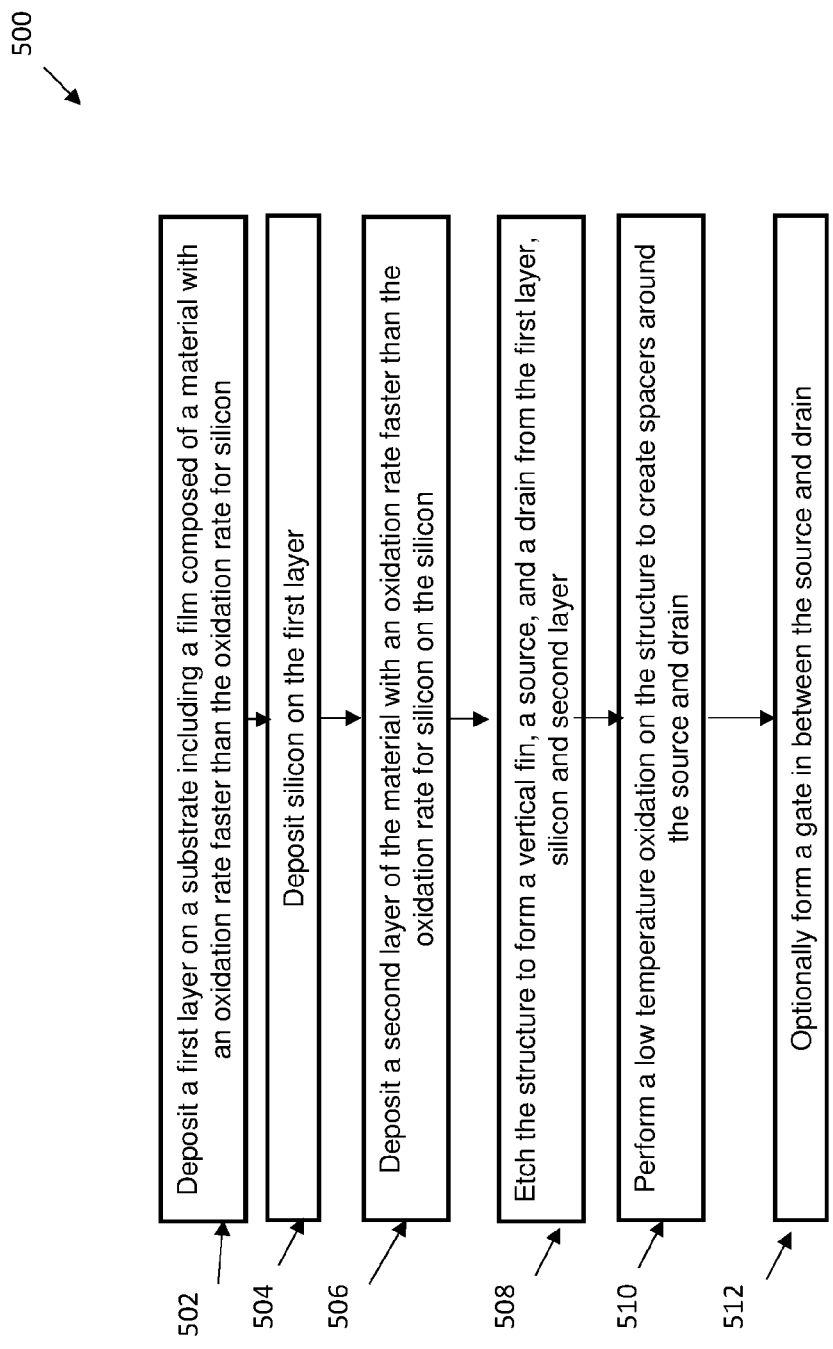
FIG. 4 is a flow diagram illustrating another method of forming a semiconductor structure according to one or more embodiments.

FIG. 4 is a flow diagram illustrating another method of forming a semiconductor structure according to one or more embodiments. The method 500 includes, as shown at block 502, depositing a first layer on a substrate including a film composed of a material with an oxidation rate faster than the oxidation rate for silicon. The method 500 also includes, as shown at block 504, depositing silicon on the first layer. As shown at block 506, the method also includes depositing a second layer of the material with an oxidation rate faster than the oxidation rate for silicon on the silicon. The method 500 also includes etching the structure to form a vertical fin, a source, and a drain from the first layer, silicon and second layer, as shown at block 508. As shown at block 510, the method 500 also includes performing a low temperature oxidation on the structure to create spacers around the source and drain. Optionally, a gate is formed in between the source and drain as shown at block 512.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

The etching process may include a dry etch (e.g., reactive ion etching, plasma etching, ion beam etching, or laser ablation). The etching process may alternatively include a wet chemical etch (e.g., with potassium hydroxide, or sulfuric acid and hydrogen peroxide). In some exemplary embodiments, both dry etching and wet chemical etching processes may be used. After transferring the pattern, the patterned photoresist is removed utilizing resist stripping processes, for example, ashing. Ashing may be used to remove a photoresist material, amorphous carbon, or organic planarization (OPL) layer. Ashing is performed using a suitable reaction gas, for example, $O_2$, $N_2$, H2/N2, $O_3$, $CF_4$, or any combination thereof.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a vertical fin structure having a top portion, a bottom portion, and vertical side walls;
   a source extending along a top surface of the vertical fin structure;
   a drain extending along a bottom surface of the vertical fin structure;
   a plurality of spacers comprising a first oxide layer extending along a surface of the source, and a second oxide layer extending along a surface of the drain;
   wherein the first oxide layer has a thickness that is equal to a thickness of the second oxide layer; and
   wherein the first oxide layer and the second oxide layer do not contact each other.

2. The semiconductor structure of claim 1, wherein the source and drain are composed of SiGe.

3. The semiconductor structure of claim 1, wherein the vertical fin structure is composed of Si.

4. The semiconductor structure of claim 1 further comprising a gate material around the vertical sidewalls of the vertical fin structure.

5. The semiconductor structure of claim 1, wherein the first oxide layer thickness and second oxide layer thickness are less than 10 nm.

6. The semiconductor structure of claim 1, wherein the source contacts the top portion of the vertical fin structure and the drain contacts the bottom portion of the vertical fin structure.

7. The semiconductor structure of claim 1, further comprising a silicon substrate.

8. The semiconductor structure of claim 1, wherein the source and drain have a source-drain height of 20 nm to 50 nm.

9. The semiconductor structure of claim 1, wherein the vertical fin has a vertical fin height of 30 nm to 100 nm.

10. The semiconductor structure of claim 1, wherein the source and drain are composed of the same material.

11. The semiconductor structure of claim 1, wherein the source and drain are composed of different materials.

12. The semiconductor structure of claim 1, wherein the source has a thickness of 20 nm to 50 nm.

13. The semiconductor structure of claim 1, wherein the drain has a thickness of 20 nm to 50 nm.

14. The semiconductor structure of claim 1, wherein a substrate comprises semiconductor material selected from the group consisting of silicon (Si), silicon germanium (SiGe), strain-relaxed buffer (SRB) SiGe, silicon carbide (SiC), and silicon-germanium-carbon (SiGeC).

15. The semiconductor structure of claim 1, wherein a substrate comprises a plurality of layers of semiconductor materials.

16. The semiconductor structure of claim 1, wherein the spacers comprise an oxide-based dielectric material.

17. The semiconductor structure of claim 1, wherein the oxide-based dielectric material comprises a material selected from the group consisting of silicon oxide, silicon nitride, boron nitride, silicon carbon, silicon oxynitride, and combinations thereof.

* * * * *